(12) United States Patent
Happ et al.

(10) Patent No.: US 7,852,657 B2
(45) Date of Patent: Dec. 14, 2010

(54) MULTIPLE WRITE CONFIGURATIONS FOR A MEMORY CELL

(75) Inventors: Thomas Happ, Tarrytown, NY (US); Jan Boris Philipp, Peekskill, NY (US)

(73) Assignee: Qimonda AG, Munich (DE)

( * ) Notice: Subject to any disclaimer, the term of this patent is extended or adjusted under 35 U.S.C. 154(b) by 218 days.

(21) Appl. No.: 11/771,747

(22) Filed: Jun. 29, 2007

(65) Prior Publication Data

US 2009/0003034 A1    Jan. 1, 2009

(51) Int. Cl.
*G11C 11/00* (2006.01)
(52) U.S. Cl. .................. 365/148; 365/163; 365/115; 365/100
(58) Field of Classification Search .......... 365/163, 365/148, 113, 100
See application file for complete search history.

(56) References Cited

U.S. PATENT DOCUMENTS

| | | | |
|---|---|---|---|
| 6,487,113 B1 * | 11/2002 | Park et al. | 365/163 |
| 6,768,665 B2 * | 7/2004 | Parkinson et al. | 365/113 |
| 7,423,901 B2 * | 9/2008 | Sutardja | 365/163 |
| 2005/0120186 A1 | 6/2005 | Happ et al. | |
| 2007/0159878 A1 * | 7/2007 | Choi et al. | 365/163 |

OTHER PUBLICATIONS

"Enhanced Write Performance of a 64Mb Phase-change Random Access Memory", Hyung-Rok Oh, Beak-Hyung Cho, Woo Yeong Cho, Sangbeom Kang, Byung-Gil Choi, Hye-Jin Kim, Ki-Sung Kim, Du-Eung Kim, Choong-Keun Kwak, Hyun-Geun Byun, Gi-Tae Jeong, Hong-Sik Jeong and Kinam Kim, ISSCC 2005/ Session 2/ Non-Volatile Memory/ 2.3, IEEE International Solid-State Circuits Conference, 2005, 3 pgs.

"Characteristics of OUM Phase Change Materials and Devices for High density Nonvolatile Commodity and Embedded Memory Applications", Tyler A. Lowrey, Stephen J. Hodgens, Wally Czubatyj, Charles H. Dennison, Sergey A. Kostyley and Guy C. Wicker, Mat. Res. Soc. Symp. Proc., vol. 803, 2004, Materials Research Society, pp. 101-112.

* cited by examiner

*Primary Examiner*—Pho M Luu
*Assistant Examiner*—Tha-o Bui
(74) *Attorney, Agent, or Firm*—Eschweiler & Associates, LLC

(57) ABSTRACT

The present invention relates to a method of programming an array of memory cells such as phase change memory cells. In this method, a selection is made between a first pulse configuration and a second pulse configuration, wherein the first and second pulse configurations are different, and wherein each pulse configuration can write at least two data states to the memory cells of the array.

13 Claims, 9 Drawing Sheets

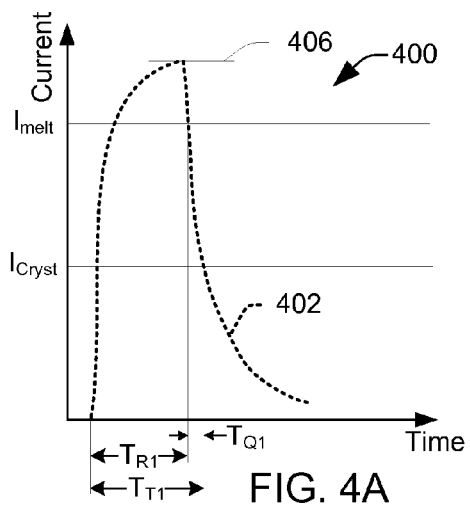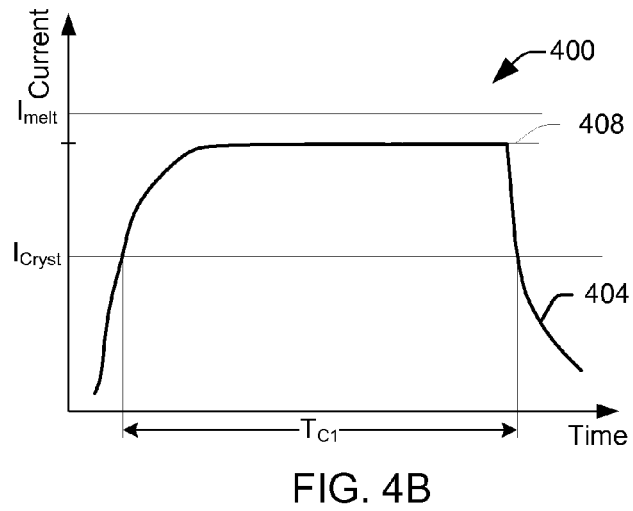
FIG. 4A
FIG. 4B

MULTIPLE WRITE CONFIGURATIONS FOR A MEMORY CELL

FIELD OF INVENTION

The present invention relates generally to semiconductors and more particularly to improved methods and devices for semiconductor memories.

BACKGROUND OF THE INVENTION

Several trends presently exist in the semiconductor and electronics industry. One of these trends is that recent generations of portable electronic devices are using more memory than previous generations. This increase in memory allows these new devices to store more data, such as music or images, and also provides the devices with more computational power and speed.

One type of memory device includes an array of resistive memory cells, where individual bits of data can be stored in the individual resistive memory cells of the array. In each resistive memory cell, a layer of programmable material is positioned between two electrodes (i.e., an anode and a cathode). Depending on how the layer of programmable material is biased, it can be put into a more resistive state or a less resistive state. In real world-implementations, the more resistive state can be associated with a logical "1" and the less resistive state can be associated with a logical "0", or vice versa. Additional resistive states could also be defined to implement a multi-bit cell with more than two states per cell. Perovskite memory, binary oxides random access memory (OxRAM), phase change random access memory (PCRAM), and conductive bridging random access memory (CBRAM) are some examples of types of resistive memory.

In resistive memories, the programmable material may tend to transition from the more resistive state to a less resistive state (or vice versa) over time, depending on which state is more energetically favorable. Due to this drift, data within individual cells may be lost or corrupted, causing data failures. Therefore, methods and devices are needed to reduce this drift. In addition, methods and systems are needed to optimize other memory features, such as access time.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment of the present invention relates to a method of programming an array of memory cells. In this method, a selection is made between a first pulse configuration and a second pulse configuration, each of which can write at least two data states to the memory cells of the array. Other embodiments are also disclosed.

The following description and annexed drawings set forth in detail certain illustrative aspects and implementations of the invention. These are indicative of only a few of the various ways in which the principles of the invention may be employed.

BRIEF DESCRIPTION OF THE DRAWINGS

FIG. 4A-4B is one embodiment of a first pulse configuration used to write at least two data states to the phase change memory cell;

DETAILED DESCRIPTION OF THE INVENTION

Figure 1:
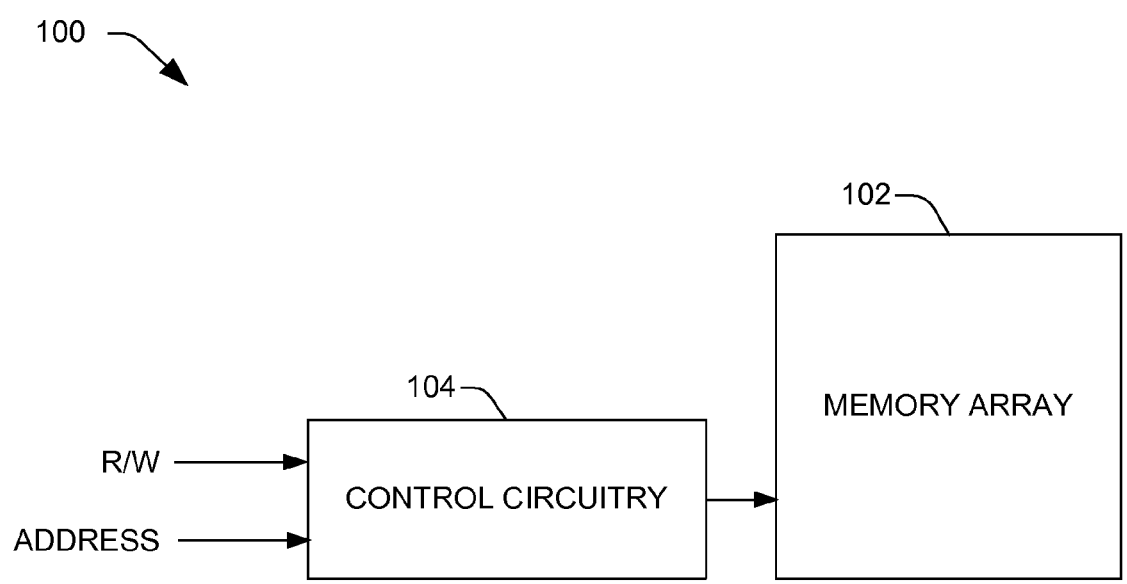
FIG. 1 is a block diagram of a memory.

One or more implementations of the present invention will now be described with reference to the attached drawings, wherein like reference numerals are used to refer to like elements throughout. In addition, when the term "relatively" is used herein, it is used to make relative comparisons between elements within this specification, and not necessarily in a more general sense of being relative to other devices in industry.

Although several embodiments are illustrated and discussed below in the context of resistive or phase-change memories, aspects of the present invention could also relate to other types of memory devices and methods associated therewith. For example, other memories that are contemplated as falling within the scope of the invention include, but are not limited to: random access memories (RAM), static random access memories (SRAM), dynamic random access memories (DRAM), read only memory (ROM), ferroelectric memories, flash memory, EEPROM, and EPROM.

FIG. 1 shows an example of a memory 100 that includes a memory array 102 of memory cells that are accessed via control circuitry 104. Typically, the control circuitry 104 receives at least an address signal (ADDRESS) and a read/write control signal (R/W), although it may receive other suitable control or data signals. Based on these signals, the control circuitry 104 accesses individual cells within the array 102, and either writes data to the addressed cells or reads data from the addressed cells, depending on whether a read or write operation has been specified.

Figure 2:
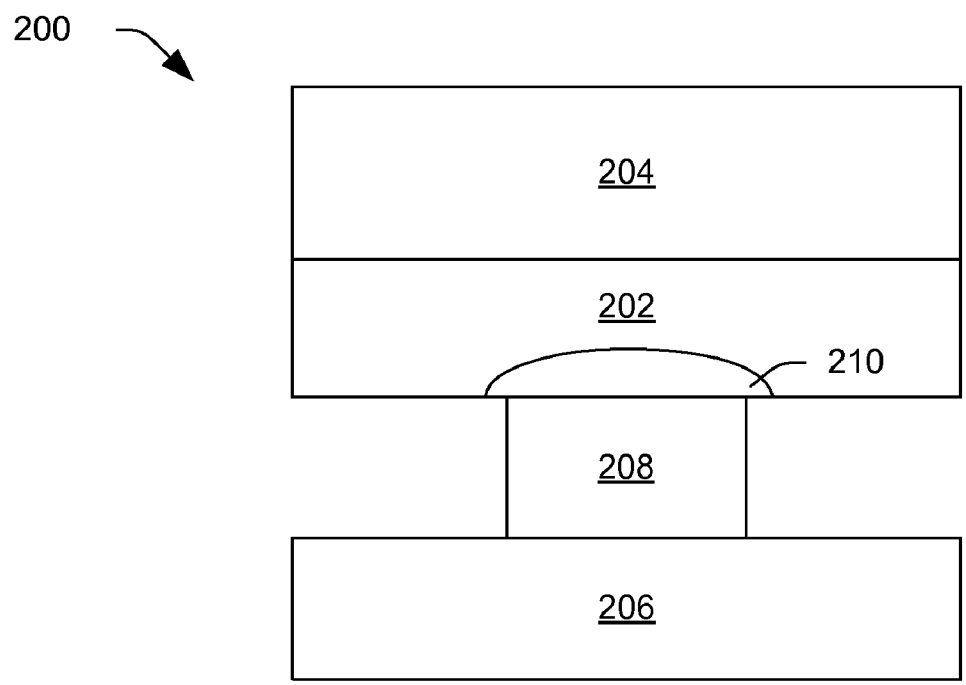
FIG. 2 is a cross-sectional diagram of one embodiment of a phase change memory cell.

Typically, the array 102 includes a number of memory cells arranged in row-column format. FIG. 2 shows an example of a phase change memory cell 200 that could be included in the array 102. The cell 200 includes a layer of programmable material 202 (e.g., a polycrystalline chalcogenide material, such as GeSbTe or an InSbTe compound, or a chalcogenide-free material, such as GeSb or GaSb) that is positioned between a top electrode 204 and a bottom electrode 206. In the illustrated embodiment, the bottom electrode 206 includes a heater member 208 that can, by means of an appropriate pulse configuration, place a programmable volume 210 of the programmable material in either an amorphous-state (i.e., relatively-high resistance state) or a crystalline state (i.e., relatively-low resistance state). These states could then be assigned to corresponding data states—for example, the amorphous-state could be assigned to a logical "0" and the crystalline-state could be assigned to a logical "1", or vice versa. In various embodiments, additional resistance states could be associated with corresponding data states to implement a multi-bit cell with more than two states per cell.

Figure 3:
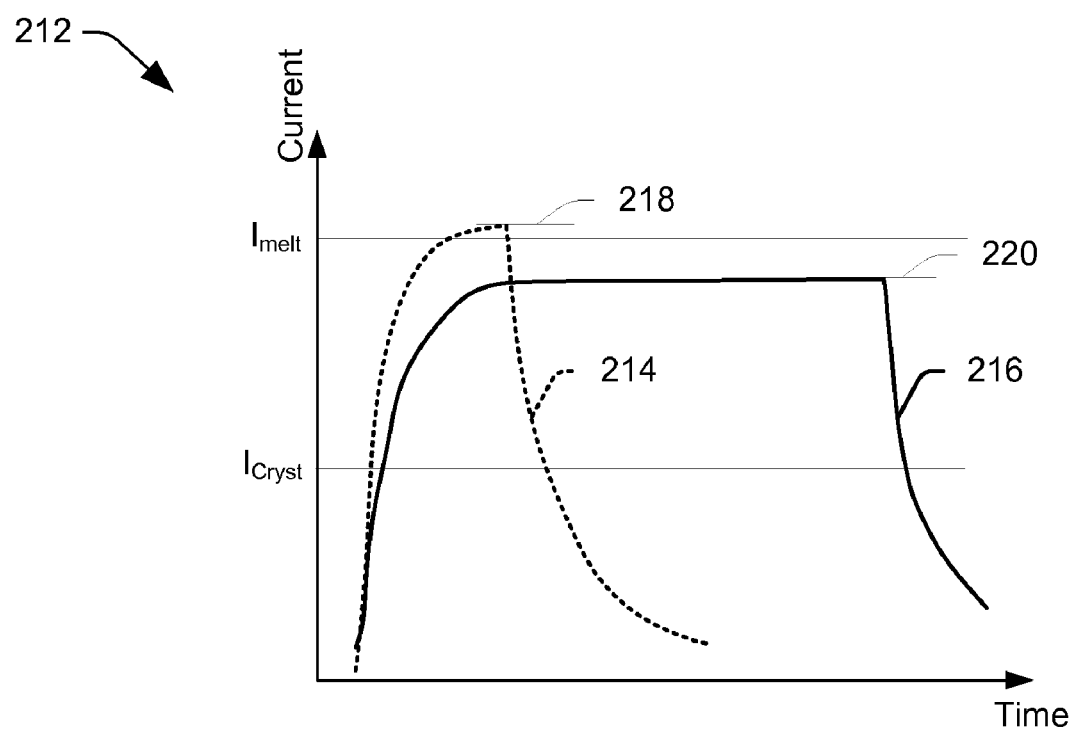
FIG. 3 is one embodiment of a pulse configuration used to write at least two data states to the phase change memory cell.

To switch between the amorphous state and the crystalline state (i.e., to write to the cell), a pulse configuration 212, such as shown in FIG. 3, could be selectively applied between the electrodes 204, 206. The illustrated pulse configuration 212 includes a RESET pulse 214 and a SET pulse 216. In essence, one could think of the RESET pulse 214 as writing a first data state (e.g., "0") into the array, and the SET pulse 216 as writing a second data state (e.g., "1") into the array, or vice versa. Thus, during operation, a combination of RESET pulses and SET pulses will typically be used to write desired data into the memory array.

It will be appreciated that although the pulse configuration 212 of FIG. 3 is very efficient in some ways—primarily because the memory device needs only relatively simple control circuitry to provide a single SET/RESET pulse pair—the pulse configuration is less than ideal for several reasons. For example, the pulse configuration does not account for the fact that the cells may drift from the amorphous state to the crystalline state, as previously mentioned. In addition, the duration of the SET pulse 216 (typically ~100 ns) is considerably longer than the duration of the RESET pulse 214 (typically ~≦10 ns). Because both SET and RESET pulses are often needed to write data into the array, the relatively long SET pulse typically dominates write speed for the memory array.

To address these and other considerations, aspects of the present invention relate to methods and devices for writing data to a memory cell by utilizing at least two pulse configurations, each of which may write at least two data states to the memory cells of the array. In selecting one of these pulse configurations, a designer can evaluate tradeoffs between data retention and speed, for example, and choose the pulse configuration that best meets his or her requirements.

In one embodiment described in FIGS. 4A-4B and FIGS. 5A-5C, the control circuit 104 is configured to provide at least two different pulse configurations to the memory array 102. The first pulse configuration 400 (FIG. 4A-4B) could write high-retention data to the memory cells, while the second pulse configuration 500 (FIGS. 5A-5C) could write data that can be quickly overwritten. Therefore, when writing to the memory array, a user could evaluate whether relatively-high retention data (which may be relatively-slow to overwrite), is more desirable than data that may be relatively-fast to overwrite (but have relatively-low retention). A discussion of the functionality of these pulse configurations is now set forth below. Although the illustrated pulse configurations show non-rectangular pulses, in other embodiments the pulse configurations can be rectangular pulses, sloped pulses, or pulses with other shapes.

As shown in FIG. 4A-4B, the first pulse configuration 400 comprises a first RESET pulse 402 and a first SET pulse 404.

In FIG. 4A, the first RESET pulse 402 can transition the programmable volume within a phase change memory cell (e.g., cell 200) to a high-retention, amorphous state (i.e., high resistance state). To effectuate this transition, the first RESET pulse 402 ramps up to a peak current 406 that heats the programmable volume of the cell above its melting point (which melting point may correspond to approximately $I_{melt}$). As the inventors have appreciated, it may be advantageous to have a peak current 406 that is sufficiently high to remove all or substantially all crystallization nuclei from the programmable volume of the cell. After the peak current is applied, the current is quickly ramped down during quench time $T_{Q1}$, thereby quickly cooling the programmable volume 210 and "freezing" disorder into the lattice. Because the peak current limits the number of crystallization nuclei, it will take a relatively long time for the cell to drift from the amorphous state to a crystalline state. Accordingly, the first RESET pulse 402 may provide high data retention.

In various embodiments, the first RESET pulse 402 could have a total duration $T_{T1}$ of approximately 10 ns, comprising a rise time $T_{R1}$ of approximately 2 ns, and a quench time $T_{Q1}$ of approximately 2 ns, although other durations could also be used depending on the implementation.

Figure 6:
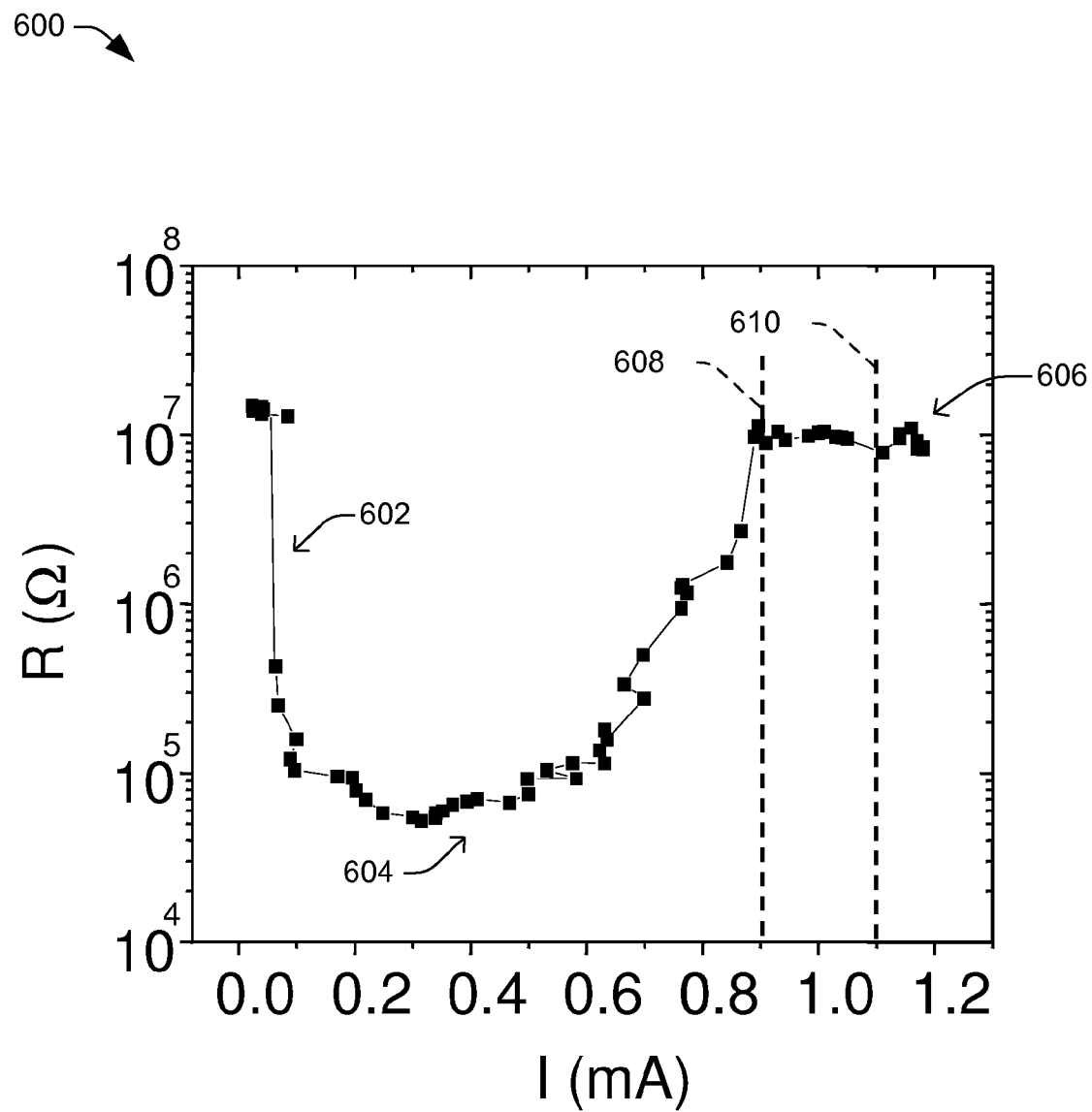
FIG. 6 is a R-I-curve showing a plot of current delivered to the cell versus resistance.

To limit the number of crystallization nuclei during RESET, in one embodiment the peak current 406 could range from approximately 120% of $I_{reset,min}$ (e.g., approximately 600 uA) to approximately 180% of $I_{reset,min}$, with $I_{reset,min}$ being the minimum current sufficient to switch the cell into its high resistance state. Referring briefly to FIG. 6, one can see an R-I-curve 600 where the current of the pulse configurations is plotted as a function of the resistance of the memory cell. Generally speaking, one can see that relatively low currents tend to transition the cell from a high-resistance state 602 to a low-resistance state 604, while relatively high currents tend to transition the cell from the low-resistance state to a high-resistance state 606. In one embodiment, $I_{reset,min}$ 608 can be the minimum current (e.g., ~0.9 mA in FIG. 6) needed to transition the cell to the highest resistance. Thus, in various embodiments to remove the crystallization nuclei, the peak current could be approximately 125% of $I_{reset,min}$ (e.g., numeral 610, which corresponds to ~1.1 mA) It will be appreciated that FIG. 6 is only illustrative and that actual values may vary widely depending on the materials used, the sizes of various device features, and a number of other variables.

Referring now to FIG. 4B, one can see that the first SET pulse 404 can transition the programmable volume of the cell to a crystalline state (i.e., low resistance state). To facilitate this transition, the first SET pulse 404 includes a maximum current 408 that heats the programmable volume above $I_{Cryst}$, which is the current corresponding to the temperature at which some minimal crystallization may occur. Notably, the maximum current 408 tends to keep the temperature of the programmable volume below the melting point of the programmable material. Generally speaking, it is believed that the first SET pulse increases the mobility of the atomic constituents of the programmable volume to allow it to crystallize for crystallization time $T_{C1}$. Therefore, after the first SET pulse, the cell will be in a crystalline state that has a relatively-low resistance.

Due to the limited number of crystallization nuclei from a prior first RESET pulse 402, the first SET pulse 404 may need to form crystallization nuclei before those nuclei can grow and the programmable volume can crystallize. Therefore, the crystallization time $T_{C1}$ may be longer than more traditional crystallization times. For example, in various embodiments where the maximum current 408 is approximately 300 uA, the crystallization time $T_{C1}$ could range from approximately 100 ns to approximately 500 ns; and could be approximately 150 ns in one embodiment.

Figure 5A:
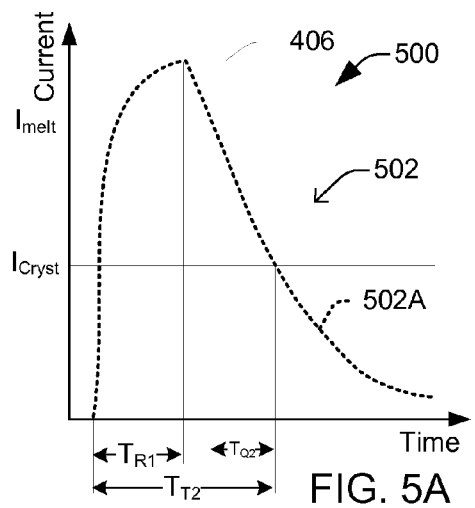
FIG. 5A-5D are embodiments of a second pulse configuration used to write at least two data states to the phase change memory cell.
Figure 5B:
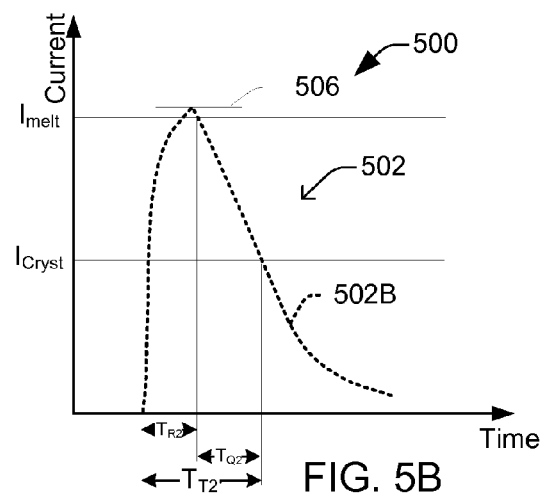
Figure 5C:
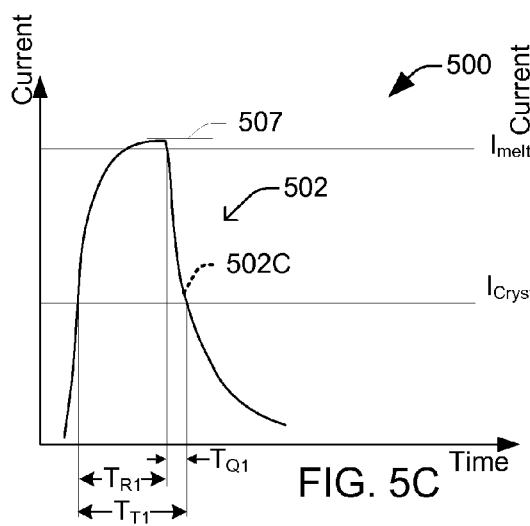

Referring now to FIG. 5A-5C, one can see the second pulse configuration 500, which can provide fast write operations. The second pulse configuration 500 comprises a second RESET pulse 502 and a second SET pulse 504.

FIG. 5A-5C show embodiments 502A, 502B, 502C in which a second RESET pulse 502 can transition the programmable volume of the cell to an amorphous state (i.e., high resistance state). In the illustrated embodiment in FIG. 5A, the second reset pulse 502A has a peak current 406 that is equal to the peak current 406 of the first RESET pulse 402, but has a relatively long quench time $T_{Q2}$ (relative to quench time $T_{Q1}$) and a relatively gradual trailing slope, which allows some crystallization nuclei to form during this quench time $T_{Q2}$. In one embodiment, the quench time could be adjusted by adjusting the gate voltage of a quench transistor on the bitline.

In the illustrated embodiment in FIG. 5B, the second reset pulse 502B may have a peak current 506 that is less than the peak current 406 as well as a relatively long quench time $T_{Q2}$ and relatively gradual trailing slope. The relatively long quench time $T_{Q2}$ and relatively-low peak current 506 may facilitate the formation of the crystallization nuclei. For example, in one embodiment where the quench time $T_{Q2}$ is approximately 5-10 ns, the peak current 506 could be 100% of $I_{reset,min}$ or 110% of $I_{reset,min}$. Thus, in some embodiments, the second RESET pulse 502 could have a total duration $T_{T2}$ of approximately 10 ns, comprising a rise time $T_{R2}$ of approximately 2 ns, and a quench time $T_{Q2}$ of approximately 5-7 ns, although other durations could also be used depending on the implementation.

In FIG. 5C, the second reset pulse may also have a peak current 507 that 1 5 is less than the peak current 406. Notably, in this embodiment, the trailing slope is the same as the trailing slope in FIG. 4.

Figure 5D:
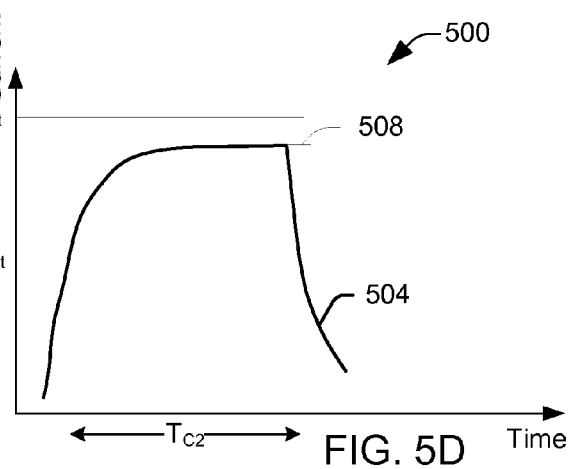

In FIG. 5D, due to the formation of the crystallization nuclei formed during quench time $T_{Q2}$, the second SET pulse 504 may have a crystallization time $T_{C2}$ that is relatively short when compared to crystallization time $T_{C1}$, provided similar currents are used. Thus, the second pulse configuration 500 can provide an overall write speed that is significantly faster than the first pulse configuration 400 and other more traditional approaches. For example, previously discussed pulse configuration 212 could have a RESET pulse duration of approximately 10 ns and a SET pulse duration of approximately 100 ns. By contrast, in one embodiment, the second pulse configuration 500 could have a RESET pulse duration 502 of approximately 10 ns, and a SET pulse duration 504 of approximately 50 ns. Therefore, when writing data into the memory array in various embodiments, the effective write time could be cut by a factor of approximately two, neglecting other fixed overhead (e.g., address decoding, bus timing, etc.).

Figure 7:
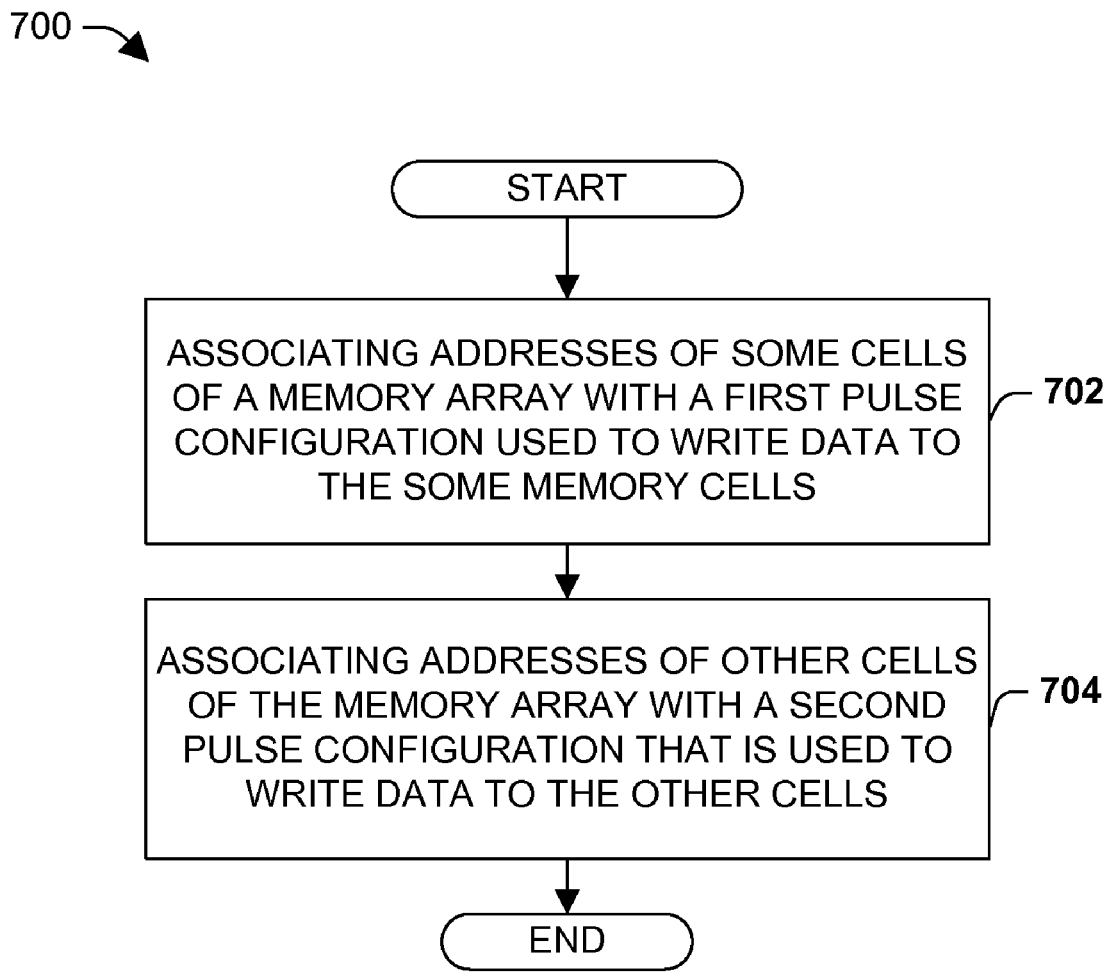
FIG. 7 is a flow diagram of a method in which first and second pulse configurations are employed to write data to a memory array.
Figure 9:
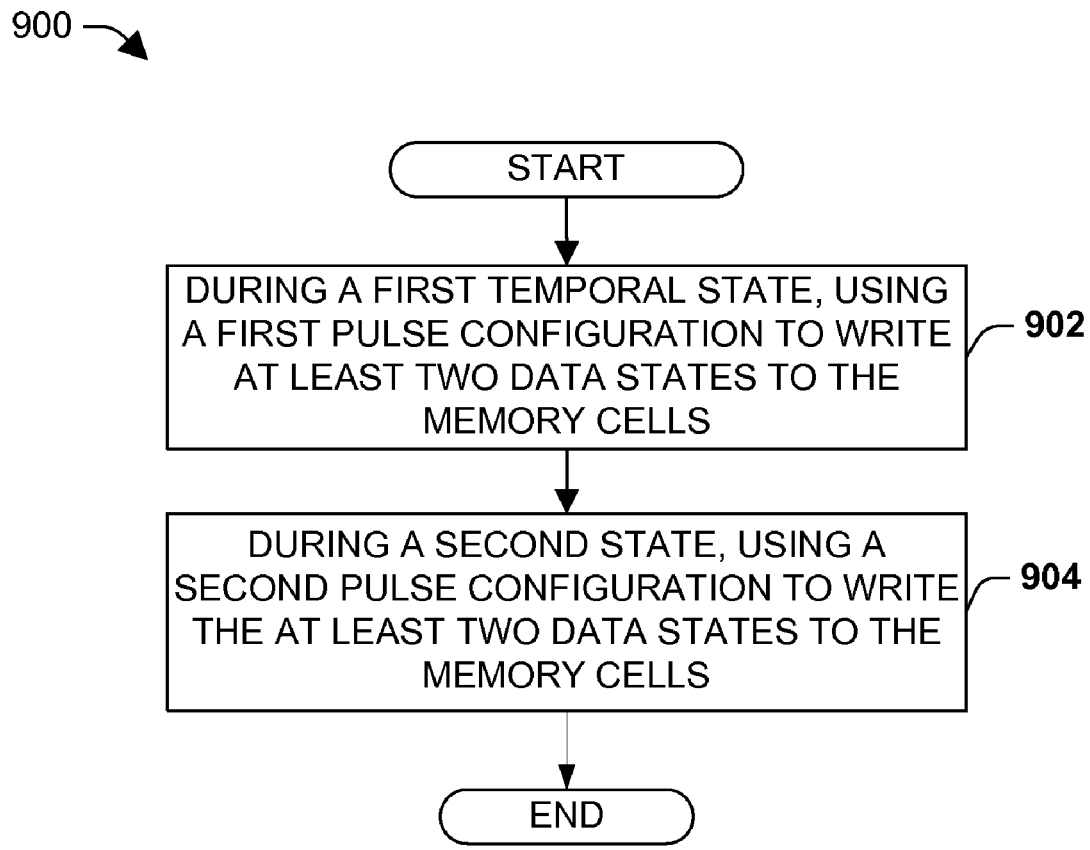
FIG. 9 is a flow diagram of another method in which first and second pulse configurations are employed to write data to a memory array.

These and other pulse configurations can be implemented in various ways to tailor the memory to a designer's liking. FIGS. 7 and 9 show two illustrative methods 700, 900 in which at least two different pulse configurations can be utilized in a memory device to provide a user with flexibility in programming. While these methods 700, 900 other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

Referring now to FIG. 7, one can see a method 700 in accordance with aspects of the invention. In 702, addresses of some cells of a memory array are associated with a first pulse configuration, which is then used to write data to those cells. In 704, addresses of other memory cells of the memory array are associated with a second pulse configuration, which is then used to write data to the other cells.

Figure 8:
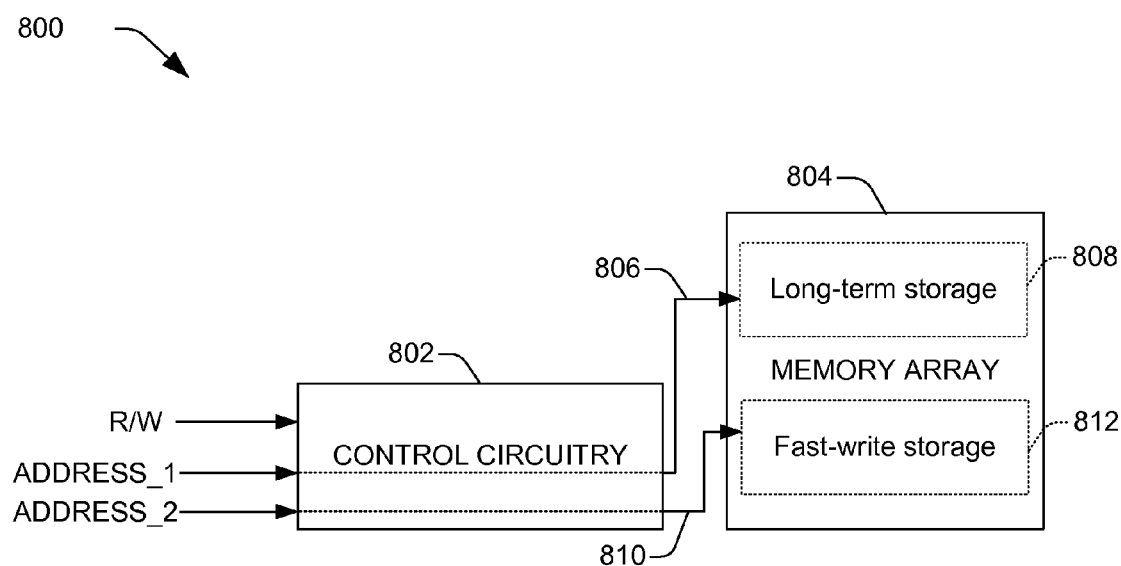
FIG. 8 is a block diagram of another memory in which first and second pulse configurations are associated with different cells within the memory array.

In various embodiments, method 700 could be employed in hardware, such as shown in FIG. 8. In FIG. 8, a memory 800 (e.g., phase change memory) can include control circuitry 802 and an array 804. The control circuitry 802 provides a first pulse configuration signal 806 for the first set of addresses (ADDRESS_1), which can relate to a first group of cells 808 within the memory array used for long-term storage (e.g., cells used to store phone numbers in a cell phone). The control circuitry 802 can also provide a second pulse configuration signal 810 for the second set of addresses (ADDRESS_2), which can relate to a second group of cells 812 within the memory array used for fast memory accesses (e.g., cells used to store instructions in a cache).

In one embodiment, the first set of addresses could be hardwired to always write via the first pulse configuration, and the second set of addresses could be hardwired to always write via the second pulse configuration. In other embodiments, the control circuitry 802 could dynamically alter how the first and second sets of addresses are associated with the first and second pulse configurations.

Referring now to FIG. 9, one can see another method 900 in accordance with aspects of the invention. In 902, during a first temporal state, a first pulse configuration is used to write at least two data states to the memory cells. In 904, during a second temporal state, a second pulse configuration is used to write the at least two data states to at least another of the memory cells. This method and all methods described herein could be employed by hardware or software, or combinations thereof.

Thus, in various embodiments, different pulse configurations could be used at different times to select different data characteristics, such as high-speed data writes or high retention data. For example, in one embodiment, during a power-down sequence or long-term data storage sequence, all bits (or part of the array; and/or all RESET bits) could be written to with the first pulse configuration to provide high-retention data. In other embodiments, during a power-up or initialization sequence, all cells could be written to using the second pulse configuration to allow high speed writes. Specifically, all RESET bits of a subset of the array could be rewritten during the power-up sequence to allow high-speed overwrite.

Figure 10:
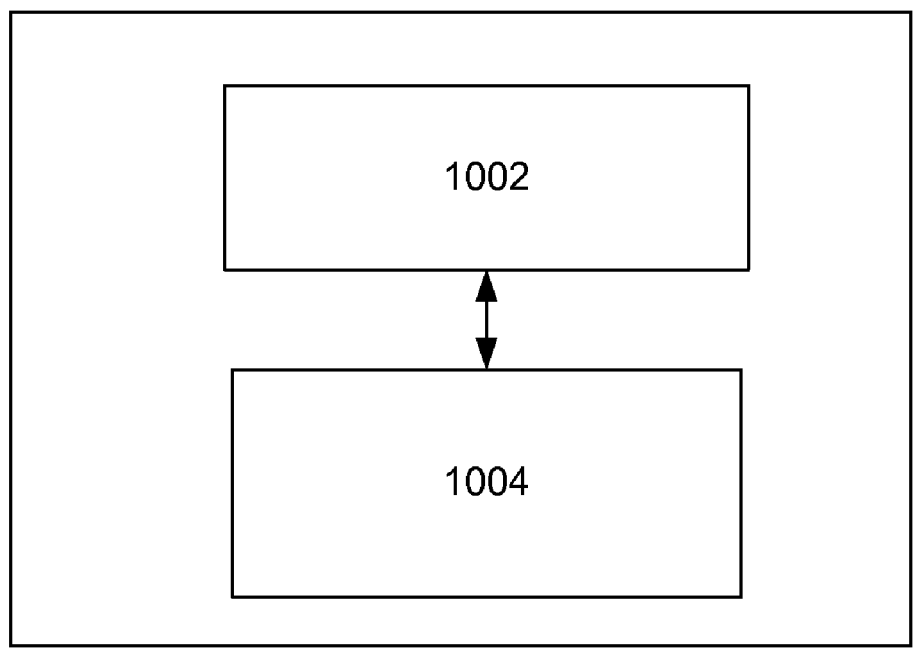
FIG. 10 is a block diagram of a data processing system in which exemplary memory devices may be utilized.

FIG. 10 shows an embodiment of a data processing system 1000 that comprises data processing circuitry 1002 configured to process data; and a memory device 1004 for storing the data. The memory device may be any memory device as described herein. For example, in one embodiment, the memory device 1004 can include an array of phase change memory cells where the processing circuitry could provide at least a first and second pulse configuration to the memory array to provide a user with flexibility in programming. In one embodiment the data processing system 1000 could be a communication device, such as a cell phone or pager, for example. In other embodiments, the data processing system 1000 could be a portable electronic product, such as a portable computer, cell phone, pager, camera, music device, voice recorder, etc. In still other embodiments, the data processing system 1000 could comprise an electronic system, such as a car, plane, industrial control system, etc.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. To the extent that the term "number" is used, it will be appreciated that such term may include any integer number, including the number "one" and extending practically to infinity. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory device, comprising:
an array of resistive memory cells;
control circuitry configured to provide first and second pulse configurations to write data to the resistive memory cells, the first pulse configuration comprising: a first reset pulse having a first peak current and a first quench time and a first set pulse having a first set pulse length; and the second pulse configuration comprising: a second reset pulse having a second peak current and a second quench time that is longer than the first quench time and a second set pulse having a second set pulse length that is less than the first set pulse length,
wherein a quench time of a reset pulse is defined as a time period associated with a falling edge of the reset pulse, and wherein both the first and second reset pulses result in a programmable volume of a respective resistive memory cell being in an amorphous state.

2. The memory device of claim 1, where the resistive memory cells are phase-change memory cells and the first peak current is sufficient to remove crystallization nuclei from programmable volumes associated with the phase-change memory cells.

3. The memory device of claim 1, where the quench time is adjusted by adjusting a gate voltage on a quench transistor of a bitline.

4. The memory device of claim 1, where the quench time of the second reset pulse is sufficient to form some crystallization nuclei in programmable volumes associated with the phase-change memory cells.

5. The memory device of claim 1, wherein the quench time of a reset pulse is defined as a time period a falling edge of the reset pulse takes to fall from a minimum current level associated with a melting point of a material associated with the resistive memory cells, and a maximum current level associated with a crystallization point of the material.

6. A memory device comprising:
means for storing bits of data;
means for providing first and second pulse configurations to write data to the means for storing the bits of data, the first pulse configuration comprising: a first reset pulse having a first quench time and a first set pulse having a first set pulse length; and the second pulse configuration comprising: a second reset pulse having a second quench time that is longer than the first quench time and a second set pulse having a second set pulse length that is less than the first set pulse length,
wherein a quench time of a reset pulse is defined as a time period associated with a falling edge of the reset pulse, and wherein both the first and second reset pulses result in a programmable volume of a respective resistive memory cell being in an amorphous state.

7. The memory device of claim 6, wherein the quench time of a reset pulse is defined as a time period a falling edge of the reset pulse takes to fall from a minimum current level associated with a melting point of a material associated with the resistive memory cells, and a maximum current level associated with a crystallization point of the material.

8. A data processing system, comprising:
data processing circuitry; and
a memory associated with the data processing circuitry, the memory being accessible via first and second pulse configurations, the first pulse configuration comprising: a first reset pulse having a first quench time and a first set pulse having a first set pulse length; and the second pulse configuration comprising: a second reset pulse having a second quench time that is longer than the first quench time and a second set pulse having a second set pulse length that is less than the first set pulse length,
wherein a quench time of a reset pulse is defined as a time period associated with a falling edge of the reset pulse, and wherein both the first and second reset pulses result in a programmable volume of a respective resistive memory cell being in an amorphous state.

9. The data processing system of claim 8, where the first reset pulse has a first peak current and second reset pulse has a second peak current that is less than the first peak current.

10. The data processing system of claim 8, where the first reset pulse has a first falling edge slope and second reset pulse has a second falling edge slope that is more gradual than the first falling edge slope.

11. The data processing system of claim 8, where the memory comprises an array of phase-change memory cells.

12. The data processing system of claim 8, where the data processing system comprises a communication device, a portable electronic product, or an electronic system.

13. The data processing system of claim 8, wherein the quench time of a reset pulse is defined as a time period a falling edge of the reset pulse takes to fall from a minimum current level associated with a melting point of a material associated with the resistive memory cells, and a maximum current level associated with a crystallization point of the material.

* * * * *